(12) United States Patent
Kim et al.

(10) Patent No.: US 9,786,573 B2
(45) Date of Patent: Oct. 10, 2017

(54) ELECTRONIC COMPONENT PACKAGE

(71) Applicant: Samsung Electro-Mechanics Co., Ltd., Suwon-si (KR)

(72) Inventors: Jong-Rip Kim, Suwon-si (KR); Doo-Hwan Lee, Uijeongbu-si (KR); Jong-Myeon Lee, Yongin-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/205,337

(22) Filed: Jul. 8, 2016

(65) Prior Publication Data

US 2017/0018474 A1 Jan. 19, 2017

(30) Foreign Application Priority Data

Jul. 15, 2015 (KR) ........................ 10-2015-0100486

(51) Int. Cl.
| | | |
|---|---|---|
| *H01L 23/495* | (2006.01) | |
| *H01L 23/31* | (2006.01) | |
| *H05K 1/02* | (2006.01) | |
| *H01L 23/00* | (2006.01) | |

(52) U.S. Cl.
CPC ....... *H01L 23/3121* (2013.01); *H05K 1/0271* (2013.01); *H01L 23/562* (2013.01); *H01L 2224/04105* (2013.01); *H01L 2924/3511* (2013.01)

(58) Field of Classification Search
CPC ......... H05K 1/185; H05K 2201/09563; H05K 2201/096; H05K 1/186; H05K 3/284; H01L 2224/04105; H01L 2924/14; H01L 2924/181; H01L 2224/05599; H01L 2224/05024; H01L 2924/3511
USPC ................................. 257/668, 669
See application file for complete search history.

(56) References Cited

U.S. PATENT DOCUMENTS

| | | | | |
|---|---|---|---|---|
| 2005/0130349 | A1* | 6/2005 | Sunohara | .............. H01L 21/563 438/108 |
| 2015/0021751 | A1* | 1/2015 | Paek | ................. H01L 23/49582 257/676 |
| 2016/0240481 | A1* | 8/2016 | Chen | ................... H01L 23/5389 |

FOREIGN PATENT DOCUMENTS

KR 10-1047485 B1 7/2011

* cited by examiner

*Primary Examiner* — Sonya D McCall Shepard
(74) *Attorney, Agent, or Firm* — NSIP Law

(57) ABSTRACT

An electronic component package includes: a core including a cavity, a first resin layer, a second resin layer and a reinforcing layer disposed between the first resin layer and the second resin layer; and an electronic component disposed in the cavity, wherein a thickness of the first resin layer is different from a thickness of the second resin layer.

11 Claims, 1 Drawing Sheet

ELECTRONIC COMPONENT PACKAGE

CROSS REFERENCE TO RELATED APPLICATION(S)

This application claims the benefit under 35 USC 119(a) of Korean Patent Application No. 10-2015-0100486 filed on Jul. 15, 2015 in the Korean Intellectual Property Office, the entire disclosure of which is incorporated herein by reference for all purposes.

BACKGROUND

1. Field

The following description relates to an electronic component package.

2. Description of Related Art

An electronic component-embedded printed circuit board has been developed in response to increased demands for multi-functional, small and thin packages. The electronic component-embedded printed circuit board is able to satisfy such demands for multi-functional, small and thin packages, and is further able to provide reliability of such packages. The electronic component-embedded printed circuit board is also able to reduce problems caused in an electrical connection process of electronic components using a wire bonding or a solder ball in a flip chip or a ball grid array (BGA).

A main reason to embed electronic components is to provide more functions in the same area. High-value-added electronic components can be protected from outside impacts by being embedded in a board material and performance of the electronic components can be optimized. In this regard, surface mount technologies that ensure improved yields of embedded electronic components and multiple functions are important technologies. When an electronic component is embedded in a printed circuit board to form an electronic component-embedded printed circuit board, the electronic component-embedded printed circuit board may experience warpage problems due to different mechanical properties of materials which surround each electronic component. Such warpage problems should be solved for mass production of electronic component-embedded printed circuit boards.

In the case of an active device which is relatively large, a warpage reduction technology may play a crucial role in a component embedding technology. Since electronic components to be embedded are becoming thinner and thinner and asymmetric structures having insulating films on a silicon die are being used, such warpage problems are becoming more prevalent.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, an electronic component package includes: a core including a cavity, a first resin layer, a second resin layer and a reinforcing layer disposed between the first resin layer and the second resin layer; and an electronic component disposed in the cavity, wherein a thickness of the first resin layer is different from a thickness of the second resin layer.

The electronic component may include a semiconductor layer and a passivation layer disposed on at least one surface of the semiconductor layer.

The passivation layer may have a coefficient of thermal expansion that is greater than a coefficient of thermal expansion of the semiconductor layer.

The first resin layer may be disposed toward a first side of the electronic component at which the passivation layer is positioned and the second resin layer may be disposed toward a second side of the electronic component that is opposite to the first side of the electronic component. The second resin layer may be thicker than the first resin layer.

The first resin layer, the second resin layer and the passivation layer may be formed of a same material.

The electronic component package may further include a circuit pattern connected to the electronic component through a conductive via which passes through the passivation layer.

The reinforcing layer may include a glass cloth.

The electronic component package may further include a molding part disposed in the cavity and surrounding the electronic component.

The electronic component may be configured to have warpage in the thickness direction of the core in response to a temperature change.

The core may be configured to have warpage in a direction opposite to the direction of the warpage of the electronic component in response to a temperature change.

According to another general aspect, an electronic component package includes: a core including a first resin layer, a second resin layer and a reinforcing layer disposed between the first resin layer and the second resin layer; and an electronic component disposed in the core and including a passivation layer disposed at a passivation layer side of the electronic component in a thickness direction of the electronic component, and a semiconductor layer disposed at a semiconductor layer side of the electronic component in the thickness direction of the electronic component, wherein the first resin layer is positioned toward the passivation layer side of the electronic component and the second resin layer is positioned toward the semiconductor layer side of the electronic component, and wherein a thickness of the first resin layer is different than a thickness of the second resin layer.

A coefficient of thermal expansion of the reinforcing layer may be less than a coefficient of thermal expansion of the first resin layer and a coefficient of thermal expansion of the second resin layer.

The first resin layer, the second resin layer and the passivation layer may be formed of a same material.

The thickness of the second resin layer may be greater than the thickness of the first resin layer.

Other features and aspects will be apparent from the following detailed description, the drawings, and the claims.

BRIEF DESCRIPTION OF THE DRAWINGS

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
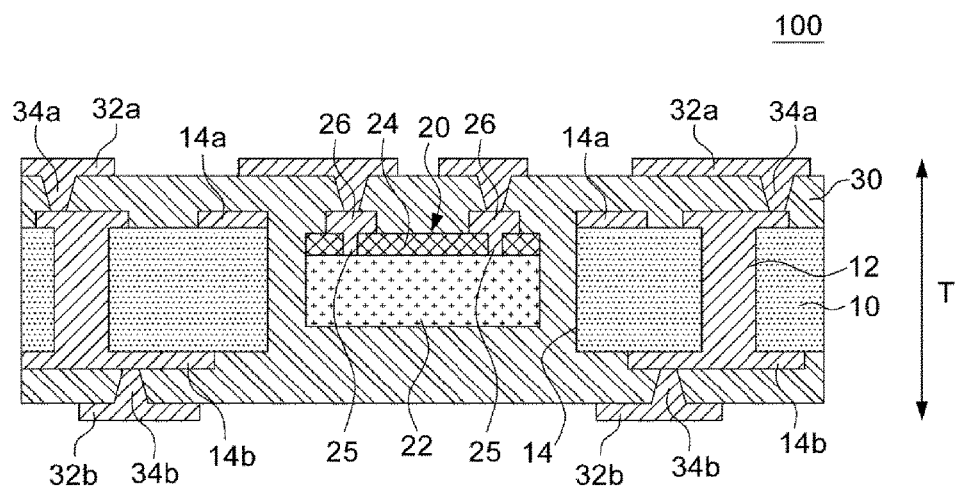
FIG. 1 is a diagram illustrating an example of an electronic component package.
Figure 2:
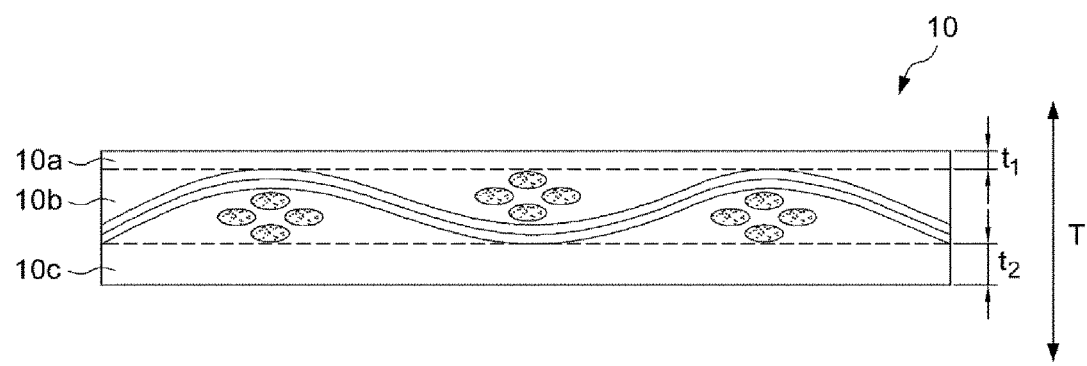
FIG. 2 is a diagram illustrating an example of a core structure included in the electronic component package of FIG. 1.

FIG. 1 is a diagram illustrating an example of an electronic component package 100. FIG. 2 is a diagram illustrating an example of a core 10 included in the electronic component package 100.

Referring to FIGS. 1 and 2, the electronic component package 100 includes the core 10 and an electronic component 20 disposed in a cavity 14 of the core 10. The electronic component 20 may be, for example, a large-scale electronic component. The core 10 and the electronic component 20 may have warpage properties that are opposite to each other. For example, when the electronic component 20 is bent upward based in thickness direction T of the core 10, the core 10 is bent downward.

As shown in FIG. 2, the core 10 includes a laminated structure including a first resin layer 10a, a second resin layer 10c, and a reinforcing layer 10b formed between the first resin layer 10a and the second resin layer 10c. Thicknesses of the resin layers 10a, 10c and the reinforcing layer 10b can be properly controlled to provide the warpage properties discussed above. The coefficient of thermal expansion of the reinforcing layer 10b is less than the coefficient of thermal expansion of the first resin layer 10a and the coefficient of thermal expansion of the second resin layer 10c, and is similar to the coefficient of thermal expansion of the electronic component 20. Thus, the warpage of the electronic component package 100 may be prevented. The thickness of the first resin layer 10a may be different from the thickness of the second resin layer 10c for this purpose. Warpage reduction by the core 10 will be described below.

The electronic component 20 has a warpage property, for example, a warpage property in the thickness direction T of the core 10, when a temperature changes. Particularly, when a package having a small size is prepared using the large-scale electronic component 20, influence of the warpage may become greater. The electronic component 20 includes a semiconductor layer 22 and a passivation layer 24 formed on at least one surface of the semiconductor layer 22 (the upper surface in FIG. 1). The electronic component 20 further includes an electrode 26 which is electrically connected with the semiconductor layer 22 and a conductive via (25) which passes through the passivation layer 24. Here, the passivation layer 24 may be a redistribution layer. The thickness of the passivation layer 24 may not be particularly limited. For example, the thickness of the passivation layer 24 may be about 10 μm to about 20 μm.

In case of the electronic component 20 having the structure described above, warpage may be caused when a temperature changes due to different coefficients of thermal expansion between the semiconductor layer 22 and the passivation layer 24. This is due to the asymmetrical structure in terms of the coefficient of thermal expansion. The passivation layer 24, which may be formed of a polyimide resin or the like, may have a greater coefficient of thermal expansion that the semiconductor layer 22, which may be formed of silicon. The coefficient of thermal expansion of the polyimide resin is 25-35 ppm/° C., which is significantly greater than the coefficient of thermal expansion of the silicon, which is 2.8-3.6 ppm/° C.

As shown in FIG. 2, the first resin layer 10a is generally positioned toward the passivation layer side of the electronic component 20 and the second resin layer 10c is generally positioned toward the opposite, semiconductor layer side of the electronic component 20 in order to alleviate warpage phenomenon caused from the electronic component 20. That is, the first resin layer 10a is positioned closer to the passivation layer 24 than it is to the semiconductor layer 22 in the width direction T, while the second resin layer 10c is positioned closer to the semiconductor layer 22 than it is to the passivation layer 24 in the width direction T. The thickness $t_2$ of the second resin layer 10c is greater than the thickness $t_1$ of the first resin layer 10a. The reinforcing layer 10b is arranged to be closer to the first resin layer 10a than the second resin layer 10c in the thickness direction T of the core 10.

The reinforcing layer 10b may include a glass cloth to provide the reinforcing layer 10b with the coefficient of thermal expansion that is less than the coefficients of thermal expansion of the first resin layer 10a and the second resin layer 10c.

When the thickness of the first resin layer 10a is the same as the thickness of the second resin layer 10c, the core 10 may theoretically not cause warpage problems when a temperature changes. However, in this example the thickness $t_1$ of the first resin layer 10a is formed to be different from the thickness $t_2$ of the second resin layer 10c to provide the core 10 with a warpage property that is opposite to the warpage property of the electronic component 20. That is, the resin layer 10a in the core 10 may be formed to be thinner toward the passivation layer 24 having the greater coefficient of thermal expansion in the electronic component 20, while the resin layer 10c in the opposite side may be formed to be thicker. Thus, the second resin layer 10c may have a greater volume change than the volume change of the first resin layer 10a in the core 10 to cause warpage which is opposite to that caused in the electronic component 20 when a temperature changes. Accordingly, overall warpage problems of the electronic component package 100 can be alleviated.

The thickness $t_1$ of the first resin layer 10a and the thickness $t_2$ of the second resin layer 10c may be controlled depending on the warpage property of the electronic component 20. The first resin layer 10a and the second resin layer 10c may be formed of the same material used for the passivation layer 24, for example, a polyimide. The core 10 having this asymmetric structure may be formed by any appropriate method which is known in the art. For example, the core 10 may be formed by forming the reinforcing layer 10b in which a glass cloth is impregnated and then laminating the resin layers 10a, 10c having a different thickness on the upper and lower surfaces, respectively, of the reinforcing layer 10b or by arranging a glass cloth biased to one side of the reinforcing layer 10b and molding the resin layers 10a and 10c.

The glass cloth included in the reinforcing layer 10b may have a coefficient of thermal expansion of about 3.2 ppm/° C., which is similar to the coefficient of thermal expansion of the silicon included in the semiconductor layer 22, which is 2.8-3.6 ppm/° C. The first resin layer 10a, the second resin layer 10c, and the passivation layer 24 are not limited to being formed of polyimide, and may be formed of other resins which are known in the art.

The electronic component package 100 further includes a molding part 30. The molding part 30 is filled in the cavity 14 of the core 10 to protect the electronic component 20. As shown in FIG. 1, the molding part 30 is formed to cover the upper part and lower part of the core 10 and surround the electronic component 20.

The electronic component package 100 further includes circuit pattern which is electrically connected to the electronic component 20. At least one of the circuit patterns 14a, 14b, 32a, 32b may be connected to the electronic component 20 through the conductive via 25 which passes through the passivation layer 24. As shown in FIG. 1, circuit patterns 32a, 32b are formed on the surface of the electronic component package 100. The circuit patterns 32a, 32b are electrically connected with circuit patterns 14a, 14b formed on the surface of the core 10 through vias 34a, 34b. The circuit patterns 14a, 14b formed on the upper and lower surfaces of the core 10 are connected with each other through a through via 12 which passes through the core 10.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component package, comprising:
   a core comprising a cavity, a first resin layer, a second resin layer and a reinforcing layer deposed between the first resin layer and the second resin layer; and
   an electronic component disposed in the cavity, and comprising a semiconductor layer and a passivation layer disposed on at least one surface of the semiconductor layer,
   wherein a thickness of the first resin layer is different from a thickness of the second resin layer,
   wherein the passivation layer comprises a coefficient of thermal expansion that is greater than a coefficient of thermal expansion of the semiconductor layer,
   wherein the first resin layer is disposed toward a first side of the electronic component at which the passivation layer is positioned and the second resin layer is disposed toward a second side of the electronic component that is opposite to the first side of the electronic component, and
   wherein the second resin layer is thicker than the first resin layer.

2. The electronic component package of claim 1, wherein the first resin layer, the second resin layer and the passivation layer are formed of a same material.

3. The electronic component package of claim 1, further comprising a circuit pattern connected to the electronic component through a conducive via which passes through the passivation layer.

4. The electronic component package of claim 1, wherein the reinforcing layer comprises a glass cloth.

5. The electronic component package of claim 1, further comprising a molding part disposed in the cavity and surrounding the electronic component.

6. The electronic component package of claim 1, wherein the electronic component is configured to have warpage in the thickness direction of the core in response to a temperature change.

7. The electronic component package of claim 1, wherein the core is configured to have warpage in a direction opposite to the direction of the warpage of the electronic component in response to a temperature change.

8. An electronic component package, comprising:
   a core comprising a first resin layer, a second resin layer and a reinforcing layer disposed between the first resin layer and the second resin layer; and
   an electronic component disposed in the core and comprising a passivation layer disposed at a passivation layer side of the electronic component in a thickness direction of the electronic component, and a semiconductor layer disposed at a semiconductor layer side of the electronic component in the thickness direction of the electronic component,
   wherein the first resin layer is positioned toward the passivation layer side of the electronic component and the second resin layer is positioned toward the semiconductor layer side of the electronic component, and
   wherein a thickness of the first resin layer is different than a thickness of the second resin layer.

9. The electronic component package of claim 8, wherein a coefficient of thermal expansion of the reinforcing layer is less than a coefficient of thermal expansion of the first resin layer and a coefficient of thermal expansion of the second resin layer.

10. The electronic component package of claim 9, wherein the first resin layer, the second resin layer and the passivation layer are formed of a same material.

11. The electronic component package of claim 9, wherein the thickness of the second resin layer is greater than the thickness of the first resin layer.

* * * * *